(12) United States Patent
Yu et al.

(10) Patent No.: US 10,593,848 B2
(45) Date of Patent: Mar. 17, 2020

(54) LIGHT EMITTING DEVICE PACKAGE AND LIGHT EMITTING APPARATUS

(71) Applicant: LG INNOTEK CO., LTD., Seoul (KR)

(72) Inventors: Dong Hyun Yu, Seoul (KR); Bong Kul Min, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 96 days.

(21) Appl. No.: 15/755,997

(22) PCT Filed: Aug. 26, 2016

(86) PCT No.: PCT/KR2016/009507
§ 371 (c)(1),
(2) Date: Feb. 27, 2018

(87) PCT Pub. No.: WO2017/039237
PCT Pub. Date: Mar. 9, 2017

(65) Prior Publication Data
US 2018/0254392 A1    Sep. 6, 2018

(30) Foreign Application Priority Data
Aug. 28, 2015 (KR) .................. 10-2015-0121635

(51) Int. Cl.
*H01L 33/62* (2010.01)
*H01L 23/495* (2006.01)
(Continued)

(52) U.S. Cl.
CPC ........ *H01L 33/62* (2013.01); *H01L 23/49575* (2013.01); *H01L 33/486* (2013.01);
(Continued)

(58) Field of Classification Search
CPC .. H01L 33/62; H01L 25/167; H01L 23/49575
See application file for complete search history.

(56) References Cited

U.S. PATENT DOCUMENTS 8,431,952 B2 * 4/2013 Hata ................ H01L 25/167
257/99
2012/0049237 A1   3/2012 Hata et al.
(Continued)

FOREIGN PATENT DOCUMENTS

JP    2004-311916 A    11/2004
JP    2010-80502 A     4/2010
(Continued)

OTHER PUBLICATIONS

International Search Report (PCT/ISA/210) issued in PCT/KR2016/009507, dated Dec. 5, 2016.

*Primary Examiner* — Phat X Cao
(74) *Attorney, Agent, or Firm* — Birch, Stewart, Kolasch & Birch, LLP

(57) ABSTRACT

A light-emitting element package according to one embodiment includes first and second lead frames electrically separated from each other; a package body including a slope configured to define a cavity along with at least one of the first or second lead frame; and at least one element unit disposed in an element area of at least one of the first or second lead frame, the element unit including a light-emitting element and a protective element, wherein the package body is disposed between the protective element and the light-emitting element.

19 Claims, 7 Drawing Sheets

(51) Int. Cl.
    *H01L 25/16*     (2006.01)
    *H01L 33/48*     (2010.01)

(52) U.S. Cl.
    CPC .. *H01L 25/167* (2013.01); *H01L 2224/32245* (2013.01); *H01L 2224/48091* (2013.01); *H01L 2224/73265* (2013.01); *H01L 2924/19107* (2013.01)

(56) References Cited

U.S. PATENT DOCUMENTS

| | | | |
|---|---|---|---|
| 2014/0197438 A1* | 7/2014 | Oh | H01L 33/58 257/98 |
| 2015/0023026 A1* | 1/2015 | Sakamoto | H01L 33/44 362/296.04 |
| 2015/0295149 A1* | 10/2015 | Kim | H01L 33/641 257/98 |
| 2016/0079217 A1* | 3/2016 | Egoshi | H01L 25/167 257/98 |

FOREIGN PATENT DOCUMENTS

| | | | |
|---|---|---|---|
| JP | 2012-49348 A | 3/2012 | |
| JP | 2014-38876 A | 2/2014 | |
| KR | 10-2011-0139514 A | 12/2011 | |
| KR | 10-2014-0029617 A | 3/2014 | |
| KR | 10-2014-0077683 A | 6/2014 | |
| WO | WO 2008/038997 A1 | 4/2008 | |

\* cited by examiner

[FIG. 1]
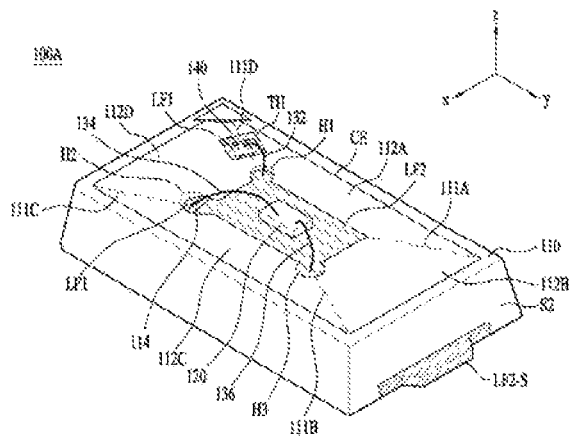
[FIG. 2]
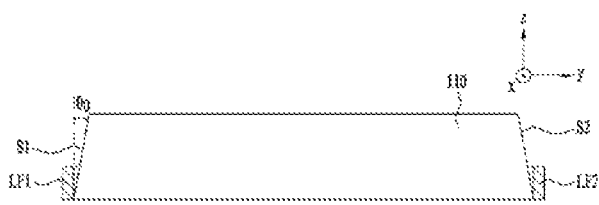
[FIG. 3]
[FIG. 4]
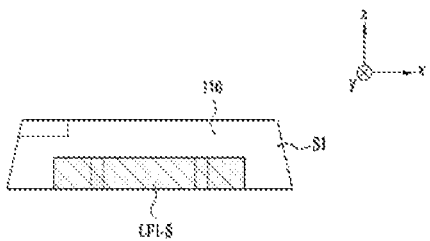

[FIG. 5]
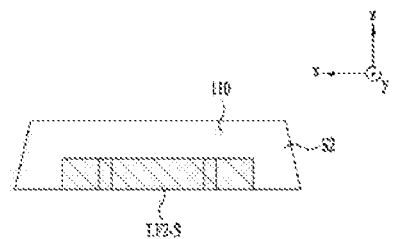
[FIG. 6a]
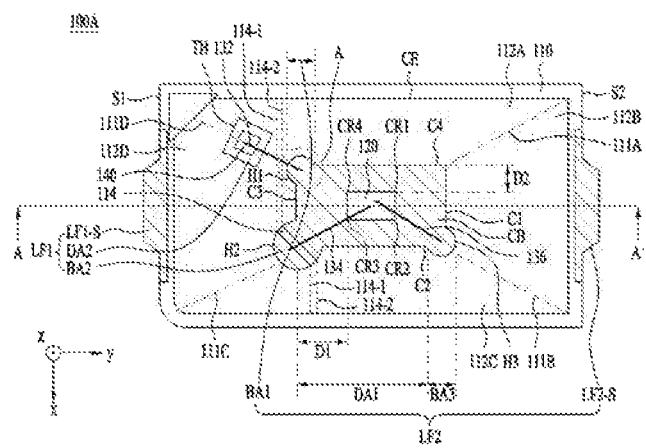
[FIG. 6b]
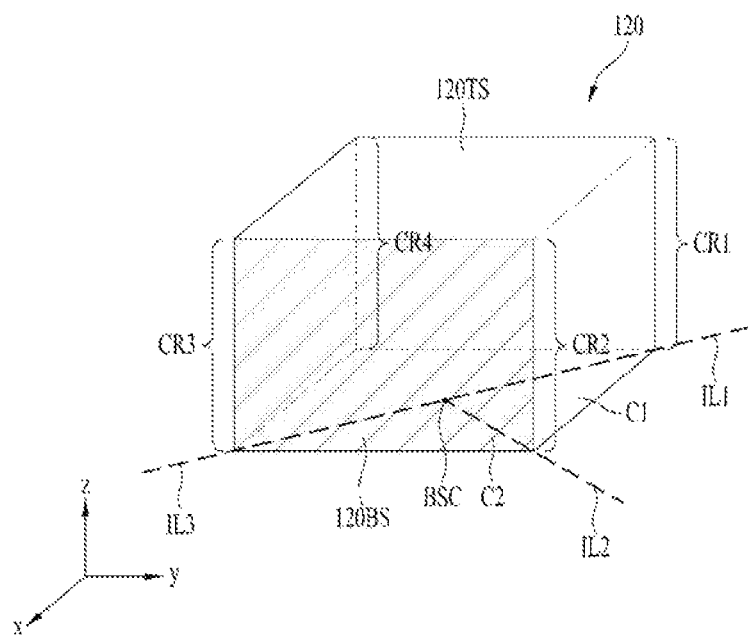

[FIG. 7]
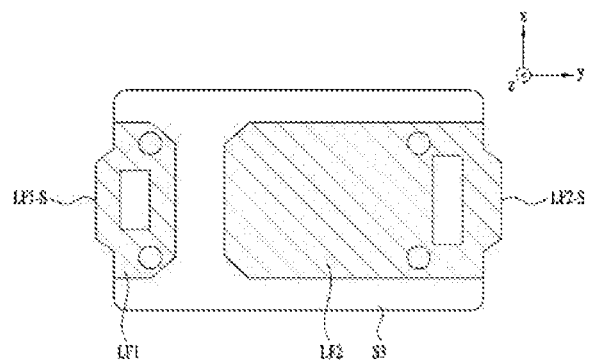
[FIG. 8]
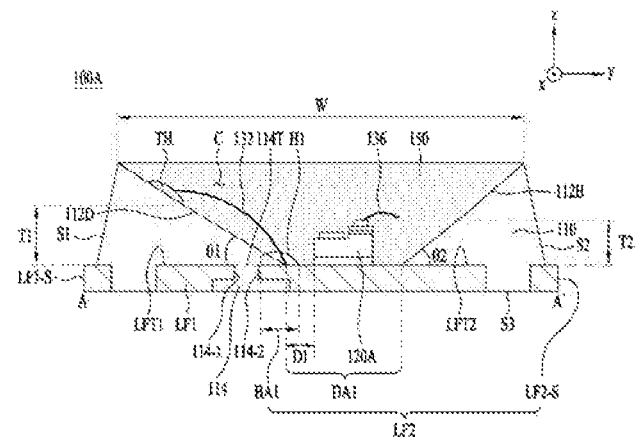
[FIG. 9]
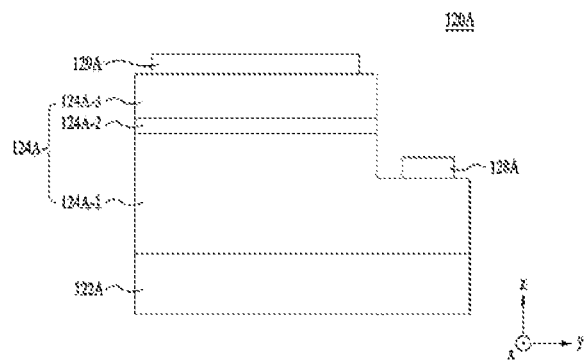

[FIG. 10]
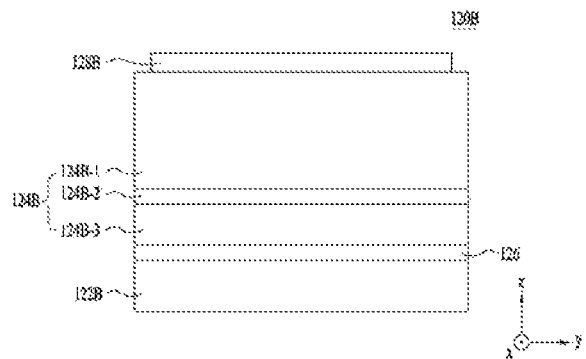
[FIG. 11a]
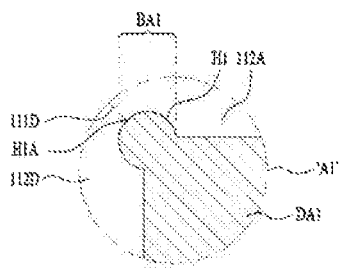
[FIG. 11b]
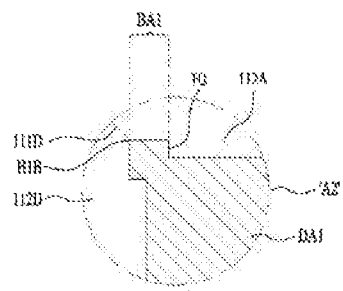
[FIG. 11c]
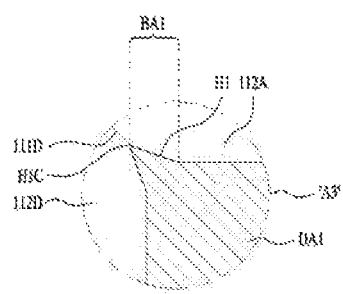

[FIG. 15]
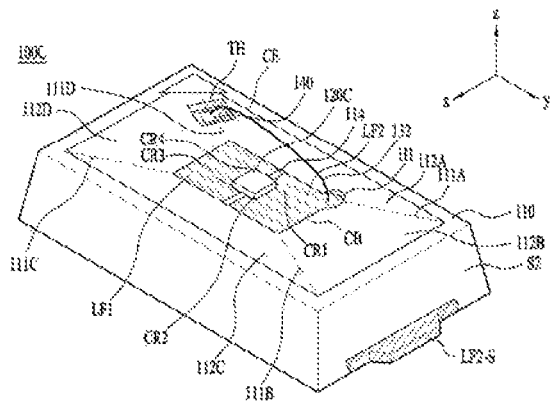
[FIG. 16]
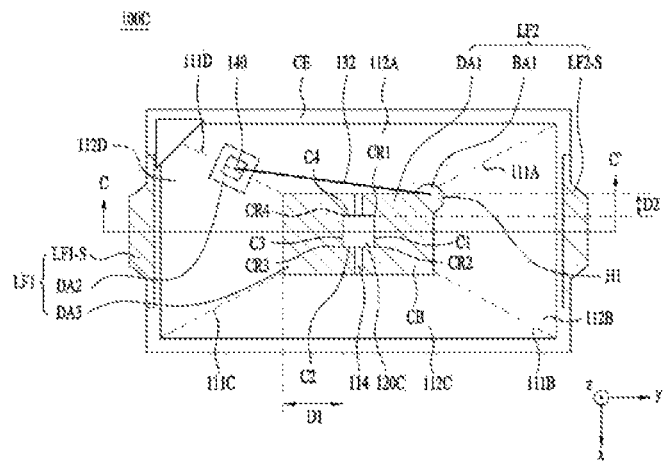
[FIG. 17]
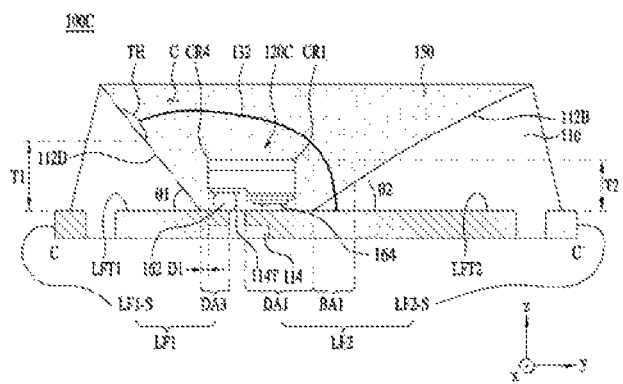

[FIG. 18]
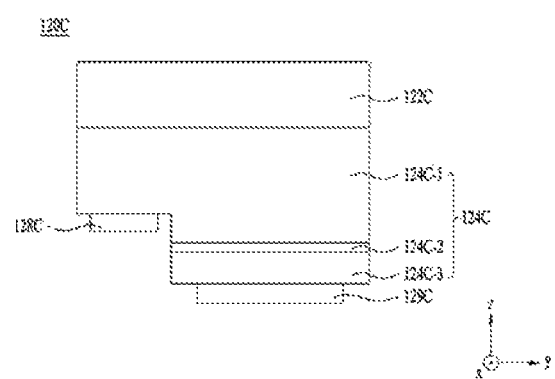

LIGHT EMITTING DEVICE PACKAGE AND LIGHT EMITTING APPARATUS

CROSS REFERENCE TO RELATED APPLICATIONS

This application is the National Phase of PCT International Application No. PCT/KR2016/009507, filed on Aug. 26, 2016, which claims priority under 35 U.S.C. 119(a) to Patent Application No. 10-2015-0121635, filed in the Republic of Korea on Aug. 28, 2015, all of which are hereby expressly incorporated by reference into the present application.

TECHNICAL FIELD

Embodiments relate to a light-emitting element package and a light-emitting apparatus.

BACKGROUND ART

Light-emitting elements such as light-emitting diodes or laser diodes using group III-V or II-VI compound semiconductors may realize various colors of light such as red, green, and blue light, as well as ultraviolet light, via the development of element materials and thin-film growth technique, and may also realize white light having high luminous efficacy via the use of a fluorescent material or by combining colors. These light-emitting elements have advantages of low power consumption, a semi-permanent lifespan, fast response speed, good safety, and eco-friendly properties compared to existing light sources such as fluorescent lamps and incandescent lamps.

Thus, the application of light-emitting elements has been expanded to a transmission module of an optical communication apparatus, a light-emitting diode backlight, which substitutes for a cold cathode fluorescent lamp (CCFL) constituting a backlight of a liquid crystal display (LCD) apparatus, a white light-emitting diode lighting apparatus, which may substitute for a fluorescent lamp or an incandescent bulb, a vehicle headlight, and a signal lamp.

When such a light-emitting element is configured in a package form, at least one of a light-emitting element or a Zener diode may be connected to a lead frame by a wire. At this time, the loss of light of a light-emitting element package may be caused due to the exposure of a bonding area of the corresponding lead frame connected to the wire.

TECHNICAL OBJECT

Embodiments provide a light-emitting element package and a light-emitting apparatus, which may minimize the loss of light due to a bonding area.

TECHNICAL SOLUTION

A light-emitting element package according to one embodiment may include first and second lead frames electrically separated from each other, a package body including a slope configured to define a cavity along with at least one of the first or second lead frame, at least one element unit disposed in an element area of at least one of the first or second lead frame, and at least one wire configured to connect the at least one element unit to a bonding area of at least one of the first or second lead frame, wherein the package body includes at least one groove portion disposed to expose the bonding area at a position at which the package body meets an imaginary straight extension line, which interconnects a side corner of the at least one element unit and a center of a bottom surface of the element unit.

For example, the at least one groove portion may be disposed in a bent portion of the slope. In addition, the bonding area may have a planar area ranging from 0.049 $mm^2$ to 0.15 $mm^2$. For example, the at least one element unit may include a light-emitting element, which includes a light-emitting structure including first and second conductive semiconductor layers and an active layer and is disposed on the second lead frame. In addition, the at least one element unit may further include a protective element disposed on the first lead frame.

For example, the at least one wire may include a first wire configured to electrically interconnect the protective element and the second lead frame. In addition, the at least one wire may further include a second wire configured to electrically interconnect the first conductive semiconductor layer of the light-emitting element and the first lead frame. In addition, the at least one wire may further include a third wire configured to electrically interconnect the second conductive semiconductor layer of the light-emitting element and the second lead frame.

For example, the first and second conductive semiconductor layers of the light-emitting element may be directly electrically connected to the first and second lead frames, respectively.

For example, the at least one bonding area may include first to third bonding areas, and the at least one groove portion may include a first groove portion configured to expose the first bonding area, which is connected to the first wire and is formed on the second lead frame, a second groove portion configured to expose the second bonding area, which is connected to the second wire and is formed on the first lead frame, and a third groove portion configured to expose the third bonding area, which is connected to the third wire and is formed on the second lead frame.

For example, the second conductive semiconductor layer of the light-emitting element may be directly electrically connected to the second lead frame.

For example, the cavity may include a bottom surface having at least one of a circular, oval, or polygonal planar shape. For example, the bonding area and the element area may be connected to each other in a planar shape, or may be separated from each other by the package body in a planar shape.

For example, the protective element may be exposed through a blind hole formed in the package body, and the blind hole may be located in a bent portion of the slope.

For example, the light-emitting element package may further include an insulation layer configured to electrically separate the first and second lead frames from each other, and the second groove portion may expose the second bonding area, a portion of the insulation layer, and a portion of the second lead frame.

For example, the at least one groove portion may have at least one of a circular or polygonal planar shape.

For example, the package body disposed between the protective element and the light-emitting element may have a thickness greater than a thickness of the light-emitting element or the protective element.

A light-emitting apparatus according to another embodiment may include the light-emitting element package.

Advantageous Effects

A light-emitting element package and a light-emitting apparatus according to embodiments may realize an increase in light extraction efficiency.

DESCRIPTION OF DRAWINGS

FIG. 1 illustrates a top perspective view of a light-emitting element package according to an embodiment.

FIG. 2 illustrates a front view of the light-emitting element package illustrated in FIG. 1.

FIG. 3 illustrates a rear view of the light-emitting element package illustrated in FIG. 1.

FIG. 4 illustrates a left side view of the light-emitting element package illustrated in FIG. 1.

FIG. 5 illustrates a right side view of the light-emitting element package illustrated in FIG. 1.

FIG. 6a illustrates a plan view of the light-emitting element package illustrated in FIG. 1, and FIG. 6b illustrates a perspective view of a light-emitting element.

FIG. 7 illustrates a bottom view of one embodiment of the light-emitting element package illustrated in FIG. 1.

FIG. 8 illustrates a cross-sectional view taken along line A-A' illustrated in FIG. 6a.

FIG. 9 illustrates a cross-sectional view of one embodiment of a light-emitting element illustrated in FIG. 1 and FIG. 6a.

FIG. 10 illustrates a cross-sectional view of another embodiment of the light-emitting element illustrated in FIG. 1 and FIG. 6a.

FIGS. 11a to 11c illustrate enlarged plan views of embodiments of portion "A" illustrated in FIG. 6a.

FIG. 12 illustrates a top perspective view of a light-emitting element package according to another embodiment.

FIG. 13 illustrates a plan view of the light-emitting element package illustrated in FIG. 12.

FIG. 14 illustrates a cross-sectional view taken along line B-B' of the light-emitting element package illustrated in FIG. 13.

FIG. 15 illustrates a top perspective view of a light-emitting element package according to a further embodiment.

FIG. 16 illustrates a plan view of the light-emitting element package illustrated in FIG. 15.

FIG. 17 illustrates a cross-sectional view taken along line C-C' of the light-emitting element package illustrated in FIG. 16.

FIG. 18 illustrates an enlarged cross-sectional view of a light-emitting element illustrated in FIG. 17.

BEST MODE

Hereinafter, embodiments will be described in detail with reference to the accompanying drawings, in order to concretely describe the disclosure and to assist in understanding of the disclosure. However, the embodiments disclosed here may be altered into various other forms, and the scope of the disclosure should not be construed as being limited to the embodiments. The embodiments disclosed here are provided in order to more completely describe the disclosure to those of ordinary skill in the art.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

Although light-emitting element packages 100A, 100B and 100C according to embodiments will be described using the Cartesian coordinate system, they may of course be described using other coordinate systems. With the Cartesian coordinate system, the x-axis, the y-axis and the z-axis may be orthogonal to one another, or may cross one another.

FIG. 1 illustrates a top perspective view of a light-emitting element package 100A according to an embodiment, FIG. 2 illustrates a front view of the light-emitting element package 100A illustrated in FIG. 1, FIG. 3 illustrates a rear view of the light-emitting element package 100A illustrated in FIG. 1, FIG. 4 illustrates a left side view of the light-emitting element package 100A illustrated in FIG. 1, FIG. 5 illustrates a right side view of the light-emitting element package 100A illustrated in FIG. 1, FIG. 6a illustrates a plan view of the light-emitting element package 100A illustrated in FIG. 1, FIG. 6b illustrates a perspective view of a light-emitting element, FIG. 7 illustrates a bottom view of one embodiment of the light-emitting element package 100A illustrated in FIG. 1, and FIG. 8 illustrates a cross-sectional view taken along line A-A' illustrated in FIG. 6a.

Hereinafter, the light-emitting element package 100A according to one embodiment will be described with reference to FIGS. 1 to 8, but the embodiment is not limited thereto. That is, the light-emitting element package 100A illustrated in FIG. 1 may have a plan view and a cross-sectional view different from a plan view and a cross-sectional view illustrated respectively in FIGS. 6a and 8, the light-emitting element package 100A illustrated in FIG. 6a may have a perspective view and a cross-sectional view different from a perspective view and a cross-sectional view illustrated respectively in FIGS. 1 and 8, and the light-emitting element package 100A illustrated in FIG. 8 may have a perspective view and a plan view different from a perspective view and a plan view illustrated respectively in FIGS. 1 and 6a.

The light-emitting element package 100A according to one embodiment may include first and second lead frames LF1 and LF2, a package body 110, an insulation layer 114, a light-emitting element 120, first to third wires 132, 134 and 136, a semiconductor element 140, and a molding member 150.

The first and second lead frames LF1 and LF2 may be disposed so as to be electrically separated from each other. To this end, the insulation layer 114 may be disposed between the first and second lead frames LF1 and LF2 to electrically separate the first and second lead frames LF1 and LF2 from each other. The first and second lead frames LF1 and LF2 may be spaced apart from each other in the y-axis direction, but the embodiment is not limited thereto. That is, according to another embodiment, as illustrated in FIG. 6a, the insulation layer 114 may have a curved planar shape. Referring to FIG. 6a, a first boundary 114-1 of the insulation layer 114, which is in contact with the first lead frame LF1, and a second boundary 114-2 of the insulation layer 114, which is in contact with the second lead frame LF2, are indicated by the dotted line. It can be appreciated that the insulation layer 114, indicated by a dotted line and a solid line, may have a curved planar shape.

Referring to FIGS. 1 to 4 and FIGS. 6a to 8, the first lead frame LF1 may include a first side portion LF1-S, a second bonding area BA2, and a second element area DA2. In addition, referring to FIGS. 1 to 3 and FIGS. 5 to 8, the second lead frame LF2 may include a second side portion LF2-S, first and third bonding areas BA1 and BA3, and a first element area DA1.

The first side portion LF1-S may be shaped so as to protrude from one side surface S1 among a plurality of side surfaces of the package body 110. The second side portion LF2-S may be shaped so as to protrude from the side surface S2 opposite the one side surface S1 of the package body 110. However, the embodiment is not limited to a particular shape of the first and second side portions LF1-S and LF2-S.

In addition, referring to FIG. 2, the one side surface S1 of the package body 110 may be inclined by a predetermined angle θ0 relative to an imaginary vertical line in a direction parallel to the z-axis direction, which is the thickness direction of the light-emitting element 120. This serves to allow the package body 110 to be easily separated from a mold when manufacturing the package body 110.

When the angle θ0 is 0°, it may be impossible to take out a product when manufacturing the package body 110 with a mold. In addition, when the angle θ0 is greater than 5°, the size of a light-emitting area may be reduced, which may cause the loss of light. Thus, the predetermined angle θ0 may be greater than 0° and equal to or less than 5°, for example, 5°, but the embodiment is not limited thereto.

In addition, in the same manner as the one side surface S1, the opposite side surface S2 of the package body 110 may be inclined by a predetermined angle. In addition, the one side surface S1 and the opposite side surface S2 may be outer wall surfaces of the package body 110 in the y-axis direction, and outer wall surfaces of the package body 110 in the x-axis direction may also be inclined by a predetermined angle, in the same manner as the one side surface S1.

The first to third bonding areas BA1, BA2 and BA3 and the first and second element areas DA1 and DA2 will be described below in detail.

In addition, as illustrated in FIG. 7, each of the first lead frame LF1 and the second lead frame LF2 may be exposed from a bottom surface S3 of the package body 110.

Each of the first and second lead frames LF1 and LF2 may be formed of a conductive material such as a metal, for example, one of titanium (Ti), copper (Cu), nickel (Ni), gold (Au), chrome (Cr), tantalum (Ta), platinum (Pt), tin (Sn), silver (Ag), and phosphorus (P), or an alloy thereof, and may have a single-layer or multi-layer structure.

The insulation layer 114 may include at least one of $SiO_2$, $TiO_2$, $ZrO_2$, $Si_3N_4$, $Al_2O_3$, or $MgF_2$, but the embodiment is not limited as to the material of the insulation layer 114.

In addition, the insulation layer 114 and the package body 110 may be separate layers, but the embodiment is not limited thereto. That is, when the package body 110 may include an insulation material, and thus have an electrical insulation property, the insulation layer 114 and the package body 110 may be integrally formed with each other.

In addition, referring to FIGS. 6a and 8, the package body 110 of the light-emitting element package 100A is illustrated as covering a portion of the insulation layer 114 while exposing the remaining portion thereof and illustrated as exposing the first element area DA1 and the first to third bonding areas BA1, BA2 and BA3 from the first and second lead frames LF1 and LF2, but the embodiment is not limited thereto. The planar area of the portion of the insulation layer 114 that is covered with the package body 110, may be equal to or greater than the planar area of the remaining portion of the insulation layer 114, which is exposed, rather than being covered with the package body 110.

According to another embodiment, the package body 110 may cover the entire insulation layer 114, and may expose the second element area DA2 of the first lead frame LF1.

In addition, in the light-emitting element package 100A according to the embodiment, slopes 112A to 112D of the package body 110 may define a cavity C along with the front surface of at least one of the exposed first or second lead frame LF1 or LF2. That is, the slopes 112A to 112D of the package body 110 may define the cavity C along with the front surface of at least one of the first or second lead frame LF1 or LF2, which is exposed, rather than being covered with the package body 110. For example, referring to FIGS. 6a and 8, the slopes 112A to 112D may define the cavity C along with the front surface of the second lead frame LF2, which is exposed, rather than being covered with the package body 110.

In addition, the upper edge CE of the cavity C may have a circular, polygonal, oval, cup-shaped, or concave container-shaped planar shape, or the like. For example, referring to FIGS. 1 and 6a, the upper edge CE of the cavity C is illustrated as having a rectangular planar shape, but the embodiment is not limited thereto.

In addition, the slopes 112A to 112D of the package body 110 may be orthogonal to or be inclined relative to the exposed front surface (or the exposed top surface LFT1 or LFT2) of at least one of the first or second lead frame LF1 or LF2. In the case of FIGS. 1 and 6a, the slopes are illustrated as including four slopes 112A, 112B, 112C and 112D forming four bent portions 111A, 111B, 111C and 111D, but the embodiment is not limited thereto.

In addition, referring to FIG. 8, each of a first angle θ1, which is formed by the slope 112D and the top surface LFT1 of the first lead frame LF1, and a second angle θ2, which is formed by the slope 112B and the top surface LFT2 of the second lead frame LF2, may be an acute angle, but the embodiment is not limited to particular values of the first and second angles θ1 and θ2.

When the slopes 112A to 112D of the package body 110 are inclined relative to the bottom surface CB of the cavity C, the width W of the cavity C may be increased with increasing distance from the bottom surface CB of the cavity C (i.e. with decreasing distance to the +z-axis direction). That is, the width W of the cavity C may be the smallest at the bottom surface CB of the cavity C, on which the light-emitting elements 120 and 120A are disposed, and may be the largest at the top surface of the package body 110.

In addition, the overall planar area of the exposed bottom surface CB of the cavity C may be variable depending on the size of the light-emitting element 120.

In addition, the slopes 112A to 112D of the package body 110 may be disposed around the light-emitting elements 120 and 120A to reflect the light discharged from the light-emitting elements 120 and 120A. In this case, the reflectance of the slopes 112A to 112D may be higher than the reflectance of the front surface of at least one of the exposed first or second lead frame LF1 or LF2. For example, the second lead frame LF2, which is exposed, rather than being covered with the package body 110, may be formed of a reflective material, for example, silver (Ag), in order to reflect the light generated from the light-emitting elements 120 and 120A, and the slopes 112A to 112D may be formed of a resin material such as polyphthalamide (PPA), which has reflectance higher than the second lead frame LF2.

Figures 12, 13, 14:
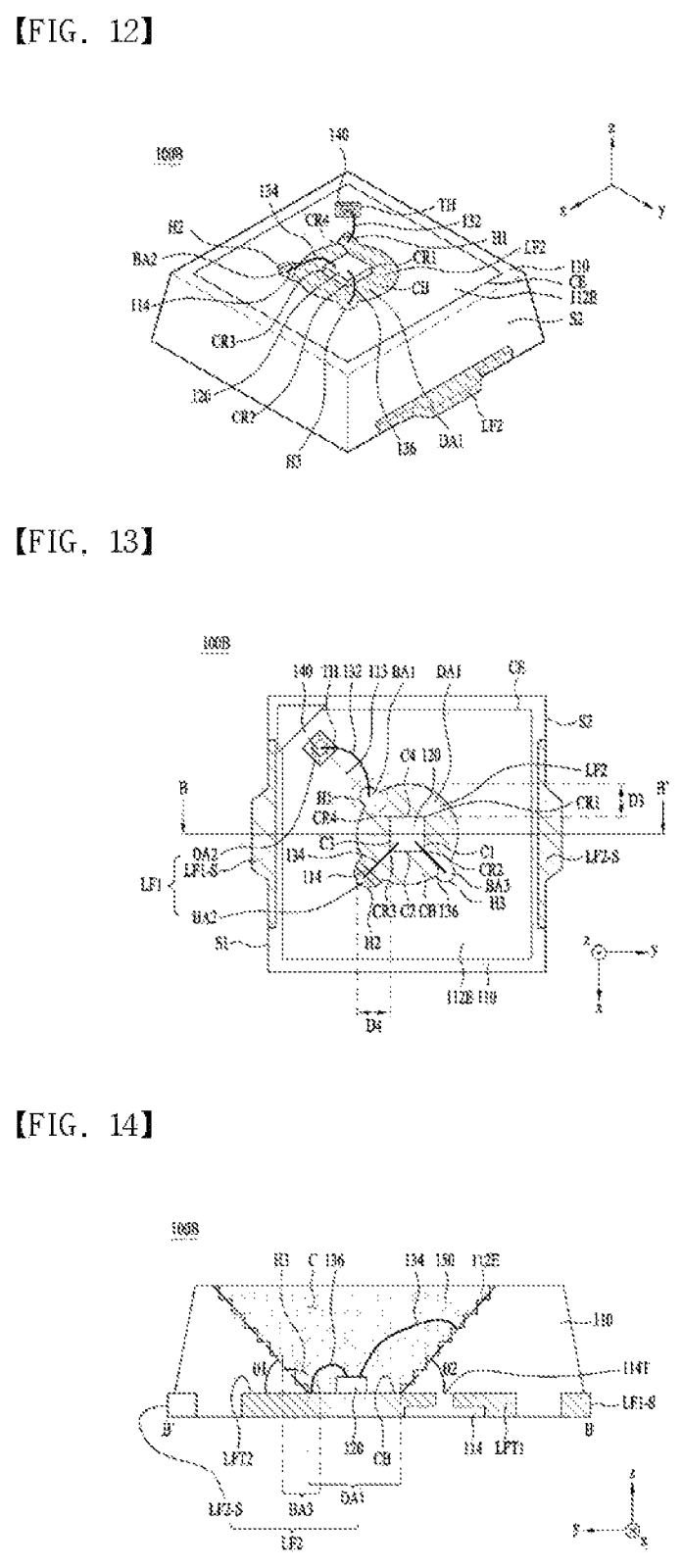

In addition, the slopes 112A to 112D of the illustrated package body 110 have a flat cross-sectional shape, but the embodiment is not limited thereto. That is, the slopes 112A to 112D may have a stepped cross-sectional shape, as illustrated in FIG. 14, which will be described later, or may have a concave or convex cross-sectional shape, although not illustrated.

Thus, the slopes 112A to 112D illustrated in FIG. 8 may have a stepped cross-sectional shape illustrated in FIG. 14, or may have a convex or concave cross-sectional shape. Alternatively, a slope 112E of the package body 110 illustrated in FIG. 14 may have a concave or convex cross-sectional shape. Alternatively, the slope 112B of the package body 110 illustrated in FIG. 17 may have a concave or convex cross-sectional shape, or may have a stepped cross-sectional shape illustrated in FIG. 14.

In addition, the slopes 112A to 112D may have at least one bent portion. For example, as illustrated in FIGS. 1, 6a, 15, and 16, the slopes 112A to 112D may include first to fourth bent portions 111A, 111B, 111C and 111D. Here, the first to fourth bent portions 111A to 111D are the boundaries of the first to fourth slopes 112A to 112D. That is, the first bent portion 111A may be the boundary of the first and second slopes 112A and 112B, the second bent portion 111B may be the boundary of the second and third slopes 112B and 112C, the third bent portion 111C may be the boundary of the third and fourth slopes 112C and 112D, and the fourth bent portion 111D may be the boundary of the fourth and first slopes 112D and 112A. However, the embodiment is not limited thereto. Referring to FIGS. 12 and 13, the slopes 112A to 112D of a light-emitting element package 100B may have no bent portion.

The package body 110 may be formed of a substrate having good insulation or thermal conductivity such as a silicon-based wafer level package, a silicon substrate, silicon carbide (SiC), or aluminum nitride (AlN), may be formed of a resin material such as polyphthalamide (PPA) having high reflectance, or may be formed of an epoxy molding compound (EMC), but the embodiment is not limited as to the material of the package body 110. When the package body 110 is formed of a plastic, discoloration may be prevented.

Meanwhile, the light-emitting element package 100A according to the embodiment may include at least one element portion. The at least one element portion may be disposed in the element area of at least one of the first or second lead frame LF1 or LF2.

According to one embodiment, the at least one element portion may include a light-emitting element disposed inside the cavity C.

According to another embodiment, the at least one element portion may further include a semiconductor element as well as a light-emitting element. In the case of FIG. 6a, the at least one element portion is illustrated as including both the light-emitting element 120 and the semiconductor element 140, but the semiconductor element 140 may be omitted in some cases.

Here, the semiconductor element 140 may be a protective element, which protects the light-emitting element package, for example, a Zener diode (ZD), but the embodiment is not limited thereto. Hereinafter, the semiconductor element 140 will be described as being a Zener diode, but the following description may also be applied in the case in which the semiconductor element 140 has a form other than that of a Zener diode.

The light-emitting element 120 may be disposed on at least one of the first or second lead frames LF1 or LF2.

For example, the light-emitting elements 120 and 120A may be disposed on the top surface LFT2 of the second lead frame LF2 inside the cavity C, as illustrated in FIGS. 1, 6a and 8, and may be disposed over the exposed front surfaces of the exposed first and second lead frames LF1 and LF2 inside the cavity C, as illustrated in FIGS. 15, 16 and 17, which will be described later.

For convenience of description, among the first and second lead frames LF1 and LF2, the lead frame on which the light-emitting element 120 is disposed is referred to as the "second lead frame LF2", and the lead frame on which the Zener diode 140 is disposed is referred to as the "first lead frame LF1".

The first element area DA1 included in the second lead frame LF2 may be defined as an area, in which the light-emitting elements 120 and 120A may be disposed, among the front surface of the second lead frame LF2 being exposed rather than being covered with the package body 110. Since the first element area DA1 is exposed to allow the light-emitting elements 120 and 120A to be disposed therein, the area thereof may be determined by the size of the light-emitting elements 120 and 120A.

In the light-emitting element package 100A according to one embodiment, the light-emitting element 120 may be a horizontal-type light-emitting diode as illustrated in FIG. 8, but the embodiment is not limited thereto. That is, in the light-emitting element package 100A illustrated in FIGS. 1 and 6a, the light-emitting element 120 may be a vertical-type light-emitting diode. Alternatively, in the light-emitting element package 100C illustrated in FIGS. 15 and 16, which will be described later, a light-emitting element 120C may be a flip-chip-type light-emitting diode, as illustrated in FIGS. 17 and 18. Here, the flip-chip-type light-emitting diode is a light-emitting diode having a flip chip bonding structure, and will be described later in detail with reference to FIG. 18.

For example, the light-emitting elements 120, 120A, 120B and 120C may be a light-emitting diode, which emits red, green, blue, or white light, but the embodiment is not limited thereto. Alternatively, the light-emitting element may be an ultraviolet (UV) light-emitting diode, which emits ultraviolet light, but the embodiment is not limited thereto.

FIG. 9 illustrates a cross-sectional view of one embodiment 120A of the light-emitting element 120 illustrated in FIG. 1 and FIG. 6a. That is, the light-emitting element 120A illustrated in FIG. 9 is illustrated in the enlarged scale of the light-emitting element 120A illustrated in FIG. 8.

Referring to FIG. 9, the horizontal-type light-emitting element 120A may include a substrate 122A, a light-emitting structure 124A, a first electrode 128A, and a second electrode 129A.

The substrate 122A may be disposed in the first element area DA1 of the exposed front surface of the second lead frame LF2. The substrate 122A may be formed of a carrier wafer, which is a material suitable for the growth of a semiconductor material. In addition, the substrate 122A may be formed of a material having excellent thermal conductivity. The substrate 122A may include at least one of sapphire $Al_2O_3$, GaN, SiC, ZnO, Si, GaP, InP, $Ga_2O_3$, or GaAs, but the embodiment is not limited as to the material of the substrate 122A. In addition, an uneven pattern (not illustrated) may be formed in the top surface of the substrate 122A.

In order to reduce the difference in the coefficient of thermal expansion (CTE) and lattice-mismatching between the substrate 122A and the light-emitting structure 124A, a buffer layer (or a transition layer) (not illustrated) may further be disposed between the two 122A and 124A. The buffer layer may include at least one material selected from the group consisting of Al, In, N and Ga, without being limited thereto. In addition, the buffer layer may have a single-layer or multilayer structure.

The light-emitting structure 124A may be disposed on the substrate 122A. For example, the light-emitting structure 124A may include a first conductive semiconductor layer 124A-1, an active layer 124A-2, and a second conductive semiconductor layer 124A-3, which are stacked in sequence on the substrate 122A.

The first conductive semiconductor layer 124A-1 is disposed on the substrate 122A. The first conductive semiconductor layer 124A-1 may be formed of a compound semiconductor such as a group III-V or II-VI compound semiconductor, which is doped with a first conductive dopant. When the first conductive semiconductor layer 124A-1 is an n-type semiconductor layer, the first conductive dopant may be an n-type dopant, and may include Si, Ge, Sn, Se, or Te, without being limited thereto.

For example, the first conductive semiconductor layer 124A-1 may include a semiconductor material having a composition of $Al_xIn_yGa_{(1-x-y)}N$ ($0 \leq x \leq 1$, $0 \leq y \leq 1$, $0 \leq x+y \leq 1$). The first conductive semiconductor layer 124A-1 may include one or more of GaN, InN, AlN, InGaN, AlGaN, InAlGaN, AlInN, AlGaAs, InGaAs, AlInGaAs, GaP, AlGaP, InGaP, AlInGaP, and InP.

The active layer 124A-2 may be disposed between the first conductive semiconductor layer 124A-1 and the second conductive semiconductor layer 124A-3. The active layer 124A-2 is a layer in which electrons (or holes) introduced through the first conductive semiconductor layer 124A-1 and holes (or electrons) introduced through the second conductive semiconductor layer 124A-3 meet each other to emit light having energy that is determined by the inherent energy band of a constituent material of the active layer 124A-2. The active layer 124A-2 may have at least one of a single-well structure, a multi-well structure, a single-quantum well structure, a multi-quantum well (MQW) structure, a quantum wire structure, or a quantum dot structure.

The active layer 124A-2 may include a well layer and a barrier layer having a pair structure of one or more selected from among InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having lower band gap energy than the band gap energy of the barrier layer.

A conductive clad layer (not illustrated) may be formed on and/or under the active layer 124A-2. The conductive clad layer may be formed of a semiconductor having higher band gap energy than the band gap energy of the barrier layer of the active layer 124A-2. For example, the conductive clad layer may include, for example, a GaN, AlGaN, InAlGaN, or super-lattice structure. In addition, the conductive clad layer may be doped to an n-type or a p-type.

In addition, the embodiment is not limited as to the wavelength band of light discharged from the active layer 124A-2.

The second conductive semiconductor layer 124A-3 may be disposed on the active layer 124A-2. The second conductive semiconductor layer 124A-3 may be formed of a semiconductor compound, and may be formed of a compound semiconductor such as a group III-V or II-VI compound semiconductor. For example, the second conductive semiconductor layer 124A-3 may include a semiconductor material having a composition of $In_xAl_yGa_{1-x-y}N$ ($0 \leq y \leq 1$, $0 \leq y \leq 1$, $0 \leq x+y \leq 1$). The second conductive semiconductor layer 124A-3 may be doped with a second condutive dopant. When the second conductive semiconductor layer 124A-3 is a p-type semiconductor layer, a second conductive dopant may be a p-type dopant, and may include Mg, Zn, Ca, Sr, Ba, or the like.

The first conductive semiconductor layer 124A-1 may be configured as an n-type semiconductor layer, and the second conductive semiconductor layer 124A-3 may be configured as a p-type semiconductor layer. Alternatively, the first conductive semiconductor layer 124A-1 may be configured as a p-type semiconductor layer, and the second conductive semiconductor layer 124A-3 may be configured as an n-type semiconductor layer.

The light-emitting structure 124A may have any one structure among an n-p junction structure, a p-n junction structure, an n-p-n junction structure, and a p-n-p junction structure.

The first electrode 128A may be disposed on the first conductive semiconductor layer 124A-1, which is exposed by mesa etching. Here, the first conductive semiconductor layer 124A-1 may be exposed by mesa-etching the second conductive semiconductor layer 124A-3, the active layer 124A-2, and a portion of the first conductive semiconductor layer 124A-1.

The first electrode 128A may include an ohmic-contact material, and thus may perform an ohmic function, which may eliminate the need for a separate ohmic layer (not illustrated) to be disposed, or a separate ohmic layer may be disposed on or under the first electrode 128A.

The second electrode 129A may be disposed on the second conductive semiconductor layer 124A-3 and be electrically connected to the second conductive semiconductor layer 124A-3. The second electrode 129A may include a transparent electrode layer (not illustrated). The transparent electrode layer may be a transparent conductive oxide (TCO). For example, the transparent electrode layer may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO, but is not limited to these materials.

The second electrode 129A may have ohmic characteristics, and may include a material for ohmic-contact with the second conductive semiconductor layer 124A-3. When the second electrode 129A performs an ohmic function, a separate ohmic layer (not illustrated) may not be formed.

Each of the first and second electrodes 128A and 129A may be formed of any material that may transmit the light discharged from the active layer 124A-2, rather than absorbing the light, and that may be grown to a high quality on the first and second conductive semiconductor layers 124A-1 and 124A-3. For example, each of the first and second electrodes 128A and 129A may be formed of a metal, and may be formed of Ag, Ni, Al, Rh, Pd, Ir, Ru, Mg, Zn, Pt, Au, Hf, or a selective combination thereof.

FIG. 10 illustrates a cross-sectional view of another embodiment 120B of the light-emitting element 120 illustrated in FIG. 1 and FIG. 6a. That is, the light-emitting element 120A illustrated in FIG. 8 may be replaced with the light-emitting element 120B illustrated in FIG. 10. In this case, a third wire 136, the third bonding area BA3, and a third groove portion H3 may be omitted.

Referring to FIG. 10, the vertical-type light-emitting element 120B may include a support substrate 122B, a reflective layer 126, a light-emitting structure 124B, and a first electrode 128B.

The support substrate 122B supports the light-emitting structure 124B. The support substrate 122B may be formed of a metal or a semiconductor material. In addition, the support substrate 122B may be formed of a material having high electrical conductivity and thermal conductivity. For example, the support substrate 122B may be formed of a metal material including at least one of copper (Cu), a Cu alloy, gold (Au), nickel (Ni), molybdenum (Mo), or a copper tungsten (Cu—W), or a semiconductor including at least one of Si, Ge, GaAs, ZnO, or SiC.

The reflective layer 126 may be disposed on the support substrate 122B. The support substrate 122B may serve as the second electrode 129A illustrated in FIG. 9.

The reflective layer 126 serves to reflect the light, which is discharged from an active layer 124B-2 of the light-emitting structure 124B and is directed to the support substrate 122B (i.e. in the −z-axis direction), rather than being emitted upward (i.e. in the +z-axis direction). That is, the reflective layer 126 may reflect the light introduced from the light-emitting structure 124B, thereby increasing the light extraction efficiency of the light-emitting element 120B. The reflective layer 126 may be formed of a light-reflecting material, for example, a metal or an alloy including at least one of Ag, Ni, Al, Rh, Pd, Ir, Ru, Mg, Zn, Pt, Au, or Hf, but the embodiment is not limited thereto.

The reflective layer 126 may be formed in multiple layers using a metal or an alloy thereof, and a light-transmitting conductive material such as IZO, IZTO, IAZO, IGZO, IGTO, AZO, or ATO, and, for example, may be formed of IZO/Ni, AZO/Ag, IZO/Ag/Ni, AZO/Ag/Ni, or the like.

Although not illustrated, an ohmic layer (not illustrated) may further be disposed between the reflective layer 126 and the second conductive semiconductor layer 124B-3. In this case, the ohmic layer may be in ohmic-contact with the second conductive semiconductor layer 124B-3, thereby serving to allow power to be smoothly supplied to the light-emitting structure 124B.

In the case of FIG. 10, the light-emitting element 120B is illustrated as including the reflective layer 126, but the embodiment is not limited thereto. That is, in some cases, the reflective layer 126 may be omitted.

The light-emitting structure 124B may be disposed on the reflective layer 126. The light-emitting structure 124B may include a second conductive semiconductor layer 124B-3, the active layer 124B-2, and a first conductive semiconductor layer 124B-1, which are stacked one above another in sequence on the reflective layer 126. Here, the first conductive semiconductor layer 124B-1, the active layer 124B-2, and the second conductive semiconductor layer 124B-3 illustrated in FIG. 10 perform the same functions as the first conductive semiconductor layer 124A-1, the active layer 124A-2, and the second conductive semiconductor layer 124A-3, resepctively, illustrated in FIG. 9, and thus a repeated description thereof will be omitted.

The first electrode 128B may be disposed on the first conductive semiconductor layer 124B-1 of the light-emitting structure 124B. The first electrode 128B may serve as the first electrode 128A illustrated in FIG. 9. Although not illustrated, the first electrode 128B may have a predetermined pattern shape. In addition, the top surface of the first conductive semiconductor layer 124B-1 may have a roughness pattern (not illustrated) in order to increase light extraction efficiency. In addition, the top surface of the first electrode 128B may be formed with a roughness pattern (not illustrated) in order to increase light extraction efficiency.

The light-emitting element 120 illustrated in each of FIGS. 1, 6a and 8 may have a horizontal or vertical bonding structure illustrated in FIG. 9 or FIG. 10, but the embodiment is not limited thereto. That is, needless to say, the light-emitting element 120 included in the light-emitting element package 100A of the embodiment may have a structure different from the structure illustrated in FIG. 9 or FIG. 10.

In the light-emitting elements 120, 120A and 120B illustrated respectively in FIG. 1, FIG. 6a, FIG. 8, and FIGS. 9, and 10, the first electrodes 128A and 128B may be electrically connected to the first lead frame LF1, and the second electrodes 129A and 122B may be electrically connected to the second lead frame LF2.

Meanwhile, the Zener diode 140 may be disposed on the first lead frame LF1, in order to increase the withstanding voltage of the light-emitting element package 100A. To this end, the second element area DA2 included in the first lead frame LF1 may be defined as the area, which is allotted in the front surface of the first lead frame LF1 to dispose the Zender diode 140. Since the second element area DA2 is exposed to allow the Zener diode 140 to be disposed thereon, the area of the second element DA2 may be determined by the size of the Zener diode 140.

The package body 110 may further include a blind hole (or a recess) TH. The blind hole TH serves to expose a portion to which one end of the first wire 132 is connected. The blind hole TH may have a shape suitable to allow the first wire 132 to be connected to the Zener diode 140. For example, when the blind hole TH is obliquely formed, the first wire 132 may be more easily introduced into the blind hole TH to thereby be connected to the Zener diode 140.

According to one embodiment, as illustrated in FIG. 1 or FIG. 6a, both the second element area DA2 and the Zener diode 140 may be exposed by the blind hole TH. According to another embodiment, unlike the illustration of FIG. 1 or FIG. 6a, the blind hole TH may not expose the entire second element area DA2, but may expose only a portion of the Zener diode 140 to which one end of the first wire 132 is connected.

In addition, referring to FIG. 6a, the blind hole TH may be spaced apart from the first element area DA1 by a predetermined distance.

Generally, in the light-emitting element package, the light discharged from the light-emitting element may be absorbed by the Zener diode, which may reduce the overall quantity of light of the light-emitting element package. However, in the case of the light-emitting element package 100A according to the embodiment, referring to FIG. 8, the first thickness T1 of the package body 110 disposed between the Zener diode 140 and the light-emitting element 120 may be greater than the second thickness T2 of the light-emitting element 120 or the third thickness T3 of the Zener diode 140. This serves to hide the Zener diode 140 from the light-emitting element 120 by the package body 110. Thus, the light discharged from the light-emitting element 120 may not be absorbed by the hidden Zener diode 140, which may increase the light extraction efficiency of the light-emitting element package 100A.

The first thickness T1 may be greater than the third thickness T3 of the Zener diode 140. When the third thickness T3 of the Zener diode 140 ranges from 50 μm to 100 μm, the first thickness T1 may be greater than 50 μm. In addition, when the first thickness T1 is less than 50 μm, the bottom surface of the cavity C, which has lower reflectance than the slopes 112A to 112D, may be excessively exposed, which may deteriorate light extraction efficiency. Therefore, the first thickness T1 may be greater than 50 µm and equal to or less than 200 µm, but the embodiment is not limited thereto.

Meanwhile, at least one element, for example, at least one of the light-emitting element 120 or the Zener diode 140 may be connected to the bonding area of at least one of the first or second lead frame LF1 or LF2 by at least one wire. This will be described below.

The at least one wire may include the first to third wires 132, 134 and 136, as illustrated in FIGS. 1, 6a and 8.

The first wire 132 serves to electrically interconnect the Zener diode 140 and the second lead frame LF2. To this end, the first wire 132 may have one end electrically connected to the Zener diode 140 and the other end electrically connected to the second lead frame LF2. In this case, the first bonding area BA1 included in the second lead frame LF2 may be defined as the area, which is electrically connected to the other end of the first wire 132, of the front surface of the second lead frame LF2. The first bonding area BA1 may be exposed by a first groove portion H1, which is included in the package body 110. That is, the first groove portion H1 exposes the first bonding area BA1 of the second lead frame LF2, which is connected to the other end of the first wire 132.

In addition, the first electrode 128A or 128B and the second electrode 129A or 122B of the light-emitting element 120; 120A or 120B according to the embodiment may be electrically connected to the first and second lead frames LF1 and LF2 by wires respectively, but the embodiment is not limited thereto.

The second wire 134 serves to electrically interconnect the first electrode 128A or 128B of the light-emitting element 120, 120A or 120B and the first lead frame LF1. Thus, the first conductive semiconductor layer 124A-1 or 124B-1 of the light-emitting element 120, 120A or 120B may be electrically connected to the first lead frame LF1 via the second wire 134. To this end, the second wire 134 may have one end electrically connected to the first electrode 128A or 128B of the light-emitting element 120, 120A or 120B and the other end electrically connected to the first lead frame LF1. In this case, the second bonding area BA2 included in the first lead frame LF1 may be the area, which is electrically connected to the other end of the second wire 134, of the front surface of the first lead frame LF1, which is exposed, rather than being covered with the package body 110.

The second bonding area BA2 may be exposed by a second groove portion H2, which is included in the package body 110. That is, the second groove portion H2 may expose the second bonding area BA2 of the first lead frame LF1, which is connected to the second wire 134. At this time, a portion of the second lead frame LF2 and the insulation layer 114, which is located on the path through which the second wire 134 passes, may be exposed, along with the second bonding area BA2, by the second groove portion H2.

When the light-emitting element 120 has a horizontal bonding structure illustrated in FIG. 9, the third wire 136 serves to electrically interconnect the second electrode 129A of the light-emitting element 120 or 120A and the second lead frame LF2. Thus, the second conductive semiconductor layer 124A-3 of the light-emitting element 120 or 120A may be electrically connected to the second lead frame LF2 via the third wire 136. To this end, the third wire 136 may have one end electrically connected to the second electrode 129A of the light-emitting element 120 or 120A and the other end electrically connected to the second lead frame LF2. In this case, the third bonding area BA3 included in the second lead frame LF2 may be the area, which is electrically connected to the other end of the third wire 136, of the front surface of the second lead frame LF2. The third bonding area BA3 may be exposed by a third groove portion H3, which is included in the package body 110. That is, the third groove portion H3 may expose the third bonding area BA3 of the second lead frame LF2, which is connected to the third wire 136.

For example, the first to third bonding areas BA1 to BA3 may have a sufficient planar area for the bonding of the first to third wires 132, 134 and 136, respectively. For example, when each of the first to third bonding areas BA1 to BA3 has a circular planar shape, and when the planar area of each of the first to third bonding areas BA1 to BA3 is less than 0.049 mm$^2$, it may be impossible to bond the wire to each of the first to third bonding areas BA1 to BA3. In addition, when the planar area of each of the first to third bonding areas BA1 to BA3 is greater than 0.15 mm$^2$, the bottom surface of the bonding areas BA1 to BA3, which has lower reflectance than the slopes 112A to 112D, may be excessively exposed, which may deteriorate light extraction efficiency. Therefore, the planar area of each of the first to third bonding areas BA1 to BA3 may range from 0.049 mm$^2$ to 0.15 mm$^2$, but the embodiment is not limited thereto.

However, when the light-emitting element 120 has a vertical bonding structure illustrated in FIG. 10, the light-emitting element package 100A may not include the third wire 136. In this case, unlike the illustration of each of FIG. 1 and FIG. 6a, the second conductive semiconductor layer 122B of the light-emitting element 120B may be directly electrically connected to the second lead frame LF2 via the support substrate 122B, which serves as the second electrode, without a wire.

In addition, referring to FIGS. 1 and 6a, the first and third bonding areas BA1 and BA3 are illustrated as being adjacent to and connected to the first element area DA1 when viewed in a planar shape, but the embodiment is not limited thereto. That is, according to another embodiment, each of the first and third bonding areas BA1 and BA3 may be spaced apart from the first element area DA1 by the package body 110 when viewed in a planar shape. In this case, the first and third groove portions H1 and H3 may be formed in the package body 110 to take the form of a blind hole (or a recess) so as to expose the first and third bonding areas BA1 and BA3, respectively.

Each of the above-described first and third groove portions H1 and H3 may be indented in the slopes 112A to 112D of the package body 110 on the second lead frame LF2. For example, the first groove portion H1 may be indented in the slopes 112A to 112D at the boundary between the first element area DA1 of the second lead frame LF2 and the first bonding area BA1. In addition, the third groove portion H3 may be indented in the slopes 112A to 112D at the boundary between the first element area DA1 of the second lead frame LF2 and the third bonding area BA3.

In addition, the second groove portion H2 may be indented in the slopes 112A to 112D of the package body 110 from the first element area DA1 of the second lead frame LF2 to the insulation layer 114 and the first lead frame LF1. In this case, as illustrated in FIG. 6a, all of the second bonding area BA2, a portion of the insulation layer 114, and the second lead frame LF2 may be exposed by the second groove portion 112, but the embodiment is not limited thereto. That is, although not illustrated, the second groove portion H2 may take the form of a blind hole, which exposes only the second bonding area BA2 and covers the insulation layer 114 and the second lead frame LF2.

According to the embodiment, the first to third groove portions H1, H2 and H3 may be formed in the positions at which the package body 110 meet virtual straight extension lines, which connect the side corners of the light-emitting element 120 to the center of the bottom surface of the light-emitting element 120. Here, referring to FIG. 6b, the side corner is a line that forms the boundary of two adjacent side surfaces among the top surface 120TS and the bottom surface 120BS of the light-emitting element 120 and the side surfaces C1, C2, C3 and C4. For example, the side corner CR1 of the light-emitting element 120 corresponds to a line that forms the boundary of two adjacent side surfaces C1 and C4, the side corner CR2 corresponds to a line that forms the boundary of two adjacent side surfaces C1 and C2, the side corner CR3 corresponds to a line that forms the boundary of two adjacent side surfaces C2 and C3, and the side corner CR4 corresponds to a line that forms the boundary of the side surfaces C3 and C4.

When the light-emitting element 120 has a rectangular planar shape, the first to third groove portions H1, H2 and H3 may be formed at positions at which the package body 110 meets virtual straight extension lines, which connect the side corners CR1, CR2, CR3 and CR4 of the light-emitting element 120 to the center of the bottom surface of the light-emitting element 120.

The first groove portion H1 may be disposed at the position at which the package body 110 meets a first virtual straight extension line, which connects a first side corner among first to fourth side corners CR1 to CR4 to the center of the bottom surface of the light-emitting element 120, and the second groove portion H2 may be disposed at the position at which the package body 110 meets a second virtual straight extension line, which connects the second side corner corresponding to any one of the side corners excluding the first side corner among the first to fourth side corners CR1 to CR4 to the center of the bottom surface of the light-emitting element 120. In addition, the third groove portion H3 may be disposed at the position at which the package body 110 meets a third virtual straight extension line, which connects the third side corner corresponding to any one of the side corners excluding the first and second side corners among the first to fourth side corners CR1 to CR4 to the center of the bottom surface of the light-emitting element 120.

For example, referring to FIGS. 6a and 6b, the first groove portion H1 may be disposed at the position at which the package body 110 meets the first virtual straight extension line, which connects the first side corner CR4 among the first to fourth side corners CR1 to CR4 to the center BSC of the bottom surface 120BS of the light-emitting element 120, and the second groove portion H2 may be disposed at the position at which the package body 110 meets a second virtual straight extension line IL3, which connects the second side corner CR3 corresponding to any one of the side corners excluding the first side corner CR4 among the first to fourth side corners CR1 to CR4 to the center BSC of the bottom surface 120BS of the light-emitting element 120. In addition, the third groove portion H3 may be disposed at the position at which the package body 110 meets a third virtual straight extension line IL2, which connects the third side corner CR2 corresponding to any one of the side corners excluding the first and second side corners CR4 and CR3 among the first to fourth side corners CR1 to CR4 to the center BSC of the bottom surface 120BS of the light-emitting element 120.

Generally, the quantity of light discharged through the side surfaces C1, C2, C3 and C4 of the light-emitting element 120 is greater than the quantity of light discharged through the side corners CR1, CR2, CR3 and CR4 of the light-emitting element 120. In consideration of this, when the first to third bonding areas BA1, BA2 and BA3 are disposed at positions at which the package body 110 meets virtual straight extension lines, which connect the side surfaces C1, C2, C3 and C4 of the light-emitting element 120, other than the side corners CR1, CR2, CR3 and CR4, to the center BSC of the bottom surface 120BS of the light-emitting element 120, the light discharged through the side surfaces of the light-emitting element 120 may be reflected by the first and second lead frames LF1 and LF2 at places in which the first to third groove portions H1 to H3 are formed, so that the quantity of light reflected by the slopes 112A to 112D of the package body 110 may be reduced.

However, according to the embodiment, when the first to third bonding areas BA1, BA2 and BA3 are disposed at positions at which the package body 110 meets the virtual straight extension lines IL2 and IL3, which connect the side corners CR1, CR2, CR3 and CR4, other than the side surfaces C1, C2, C3 and C4 of the light-emitting element 120, to the center BSC of the bottom surface 120BS of the light-emitting element 120, the light discharged through the side surfaces C1, C2, C3 and C4 of the light-emitting element 120 may be reflected by the slopes 112A to 112D of the package body 110 in which the first to third groove portions H1 to H3 are not formed, instead of the first and second lead frames LF1 and LF2, so that the quantity of light reflected by the slopes 112A to 112D of the package body 110 may be increased, which may increase the quantity of light emitted from the light-emitting element package 100A.

In addition, the blind hole TH and the first to third groove portions H1, H2 and H3 may be disposed on the first to fourth bent portions 111A, 111B, 111C and 111D. That is, the blind hole TH and the first to third groove portions H1, H2 and H3 may be disposed closer to the corners than the sides of the bottom surface CB of the cavity C. Here, the respective sides of the bottom surface CB correspond to the sides C1, C2, C3 and C4 of the light-emitting element 120. For example, referring to FIG. 6a, the first groove portion H1 and the blind hole TH may be disposed in the fourth bent portion 111D, the second groove portion H2 may be disposed in the third bent portion 111C, and the third groove portion H3 may be disposed in the second bent portion 111B.

As described above, when the blind hole TH and the first to third groove portions H1 to H3 are disposed in any one of the first to fourth bent portions 111A to 111D, which are closer to the corners of the bottom surface CB of the cavity C than the sides of the bottom surface CB, a quantity of light discharged through the side surfaces of the light-emitting element 120 may increase because a quantity of the light reflected by the slopes 112A, 112B, 112C and 112D is increased, which may increase the quantity of light to be emitted, compared to the case in which the same TH, H1, H2 and H3 are disposed in any one of the slopes 112A to 112D, other than the first to fourth bent portions 111A to 111D. This is because the reflectance of the first to fourth bent portions 111A to 111D is lower than the reflectance of the slopes 112A, 112B, 112C and 112D.

As described above, when the blind hole TH and the first to third groove portions H1 to H3 are disposed in any one of the first to fourth bent portions 111A to 111D in the embodiments, the quantity of light emitted from the light-emitting element package 100A may be increased, compared to the case in which the blind hole TH and the first to third groove portions H1 to H3 are disposed in the slopes 112A to 112D, other than the first to fourth bent portions 111A to 111D.

Each of the first to third bonding areas BA1 to BA3 described above may have an area larger than the minimum area required for wire bonding because it is the area for the bonding of the first to third wires 132 to 136.

In addition, the first to fourth bent portions 111A, 111B, 111C and 111D of the slopes 112A to 112D of the package body 110 are located on the same line as the side corners CR1 to CR4 of the light-emitting element 120 and the center BSC of the bottom surface 120BS of the light-emitting element 120, but the embodiment is not limited thereto.

FIGS. 11a to 11c illustrate enlarged plan views of embodiments A1, A2 and A3 of portion "A" illustrated in FIG. 6a.

According to the embodiment, each of the first to third groove portions H1, H2 and H3 may have at least one of a circular or polygonal planar shape. For example, the first groove portion H1 may have a circular planar shape, as illustrated in FIG. 11a, may have a diamond-shaped planar shape, as illustrated in FIG. 11b, or may have a triangular planar shape, as illustrated in FIG. 11c. At this time, in the planar shape of the first groove portion H1, apexes H1A, H1B and H1C may be disposed on the same line as the side corners CR1, CR2, CR3 and CR4 of the light-emitting element 120 and the center BSC of the bottom surface 120BS of the light-emitting element 120.

Needless to say, the second or third groove portion H2 or H3 may have any of the planar shapes illustrated in FIGS. 11a to 11c.

FIG. 12 illustrates a top perspective view of the light-emitting element package 100B according to another embodiment, FIG. 13 illustrates a plan view of the light-emitting element package 100B illustrated in FIG. 12, and FIG. 14 illustrates a cross-sectional view taken along line B-B' of the light-emitting element package 100B illustrated in FIG. 13.

In the same manner as the planar shape of the upper edge CE of the cavity C, each of the first element area DA1 and the second element area DA2 may have at least one of a circular, oval, or polygonal planar shape based on the purpose and design thereof, but the embodiment is not limited thereto.

For example, the first element area DA1 belonging to the bottom surface CB of the cavity C may have a rectangular planar shape, as illustrated in FIGS. 1 and 6a. Alternatively, in another example, the first element area DA1 belonging to the bottom surface CB of the cavity C may have a circular planar shape, as illustrated in FIGS. 12 and 13. In addition, in the case of FIGS. 12 and 13, the upper edge CE of the cavity C is illustrated as having a rectangular planar shape, but may have a circular planar shape in the same manner as the first element area DA1.

In this case, the slope 112E of the package body 110 may not include the bent portions 111A, 111B, 111C and 111D, as illustrated in FIGS. 1 and 6a.

As described above, excluding that the first element area DA1 has a different planar shape and the slope 112E does not include the first to fourth bent portions 111A, 111B, 111C and 111D, the light-emitting element package 100B illustrated in FIGS. 12, 13 and 14 is the same as the light-emitting element package 100A illustrated in FIGS. 1, 6a and 8, and thus a repeated description will be omitted below.

In the light-emitting element package 100B, the first to third bonding areas BA1 to BA3 may be disposed at positions at which the package body 110 meets virtual straight extension lines, which connect the side corners CR1 to CR4 of the light-emitting element 120 to the center BSC of the bottom surface 120BS of the light-emitting element 120. That is, the first to third groove portions H1 to H3, which respectively expose the first to third bonding areas BA1 to BA3, may be disposed at positions at which the package body 110 meets virtual straight extension lines, which connect the side corners CR2 to CR4 of the light-emitting element 120 to the center BSC of the bottom surface 120BS of the light-emitting element 120. For example, on the slope 112E having no bent portion, the blind hole TH and the first bonding area BA1 may be disposed on the same line as the fourth side corner CR4 and the center BSC of the bottom surface 120BS of the light-emitting element 120, the second bonding area BA2 may be disposed on the same line as the third side corner CR3 and the center BSC of the bottom surface 120BS of the light-emitting element 120, and the third bonding area BA3 may be disposed on the same line as the second side corner CR2 and the center BSC of the bottom surface 120BS of the light-emitting element 120. However, the embodiment is not limited thereto.

FIG. 15 illustrates a top perspective view of the light-emitting element package 100C according to a further embodiment, FIG. 16 illustrates a plan view of the light-emitting element package 100C illustrated in FIG. 15, FIG. 17 illustrates a cross-sectional view taken along line C-C' of the light-emitting element package 100C illustrated in FIG. 16, and FIG. 18 illustrates an enlarged cross-sectional view of the light-emitting element 120C illustrated in FIG. 17.

The light-emitting element 120C illustrated in FIGS. 15 to 17 is disposed so as to be directly electrically connected to the first and second lead frames LF1 and LF2, rather than being electrically connected to the first and second lead frames LF1 and LF2 via wires. To this end, the first and second lead frames LF1 and LF2 are exposed through the cavity C so as to be directly connected to the light-emitting element 120C. Thus, unlike the illustration of FIGS. 1, 6a and 8, the light-emitting element package 100C illustrated in FIGS. 15, 16 and 17 includes only the first wire 132 without the second and third wires 134 and 136.

In addition, in the case of FIGS. 1, 6a and 8, the first groove portion H1, which exposes the first bonding area BA1, is disposed at the position at which the package body 110 meets a virtual straight extension line, which connects the fourth side corner CR4 of the light-emitting elements 120 and 120A to the center BSC of the bottom surface 120BS of the light-emitting elements 120 and 120A, whereas, in the case of FIGS. 15, 16 and 17, referring also to FIG. 6b, the first groove portion H1, which exposes the first bonding area BA1, is disposed at the position at which the package body 110 meets a virtual straight extension line ILL which connects the first side corner CR1 of the light-emitting element 120C to the center BSC of the bottom surface 120BS of the light-emitting element 120C. However, the embodiment is not limited thereto. That is, the first groove portion H1 illustrated in FIGS. 15, 16 and 17 may be disposed at the position at which the package body 110 meets an imaginary straight extension line IL2, which connects one of the second to fourth side corners CR2 to CR4 of the light-emitting element 120C, for example, the second side corner CR2, to the center BSC of the bottom surface 120BS of the light-emitting element 120C.

In addition, unlike the cavity C illustrated in FIG. 8, referring to FIG. 17, it can be appreciated that, in addition to the top surface LFT2 of the second lead frame LF2 forming the first element area DA1 and the slopes 112A to 112D, the top surface LFT1 of the first lead frame LF1 forming a third element area DA3 and the top surface 114T of the insulation layer 114 may also define the cavity C.

In the case of the light-emitting element package 100C according to the further embodiment, the first lead frame LF1 may further include the third element area DA3. The third element area DA3 may be defined as the area, which is allotted in the front surface of the first lead frame LF1 to dispose a portion of the light-emitting element 120C. Since the third element area DA3 is the area, which is exposed so that a portion of the light-emitting element 120C is disposed thereon, the area of the third element area may be determined by the size of the light-emitting element 120C.

Excluding the above-described differences, the light-emitting element package 100C illustrated in FIGS. 15, 16 and is the same as the light-emitting element package 100A illustrated in FIGS. 1, 6a and 8, and thus a description related to the same parts will be omitted and only different parts will be described below. For example, the front view, the rear view, the left side view, the right side view, and the bottom view of the light-emitting element package 100C may respectively the same as the front view illustrated in FIG. 2, the rear view illustrated in FIG. 3, the left side view illustrated in FIG. 4, the right view illustrated in FIG. 5, and the bottom view illustrated in FIG. 7.

The light-emitting element 120 included in the light-emitting element packages 100A and 100B according to the above-described embodiments may have a horizontal bonding structure illustrated in FIG. 9, or may have a vertical bonding structure illustrated in FIG. 10. On the other hand, the light-emitting element 120C included in the light-emitting element package 100C may have a flip chip bonding structure illustrated in FIGS. 15, 16 and 17.

FIG. 18 illustrates an enlarged cross-sectional view of the light-emitting element 120C illustrated in FIG. 17.

Referring to FIG. 18, the light-emitting element 120C having a flip chip bonding structure may include a substrate 122C, a light-emitting structure 124C, and first and second electrodes 128C and 129C. Here, the substrate 122C, the light-emitting structure 124C, and the first and second electrodes 128C and 129C perform the same function as the substrate 122A, the light-emitting structure 124A, and the first and second electrodes 128A and 129A illustrated in FIG. 9, and thus a repeated description thereof will be omitted. That is, the first conductive semiconductor layer 124C-1, the active layer 124C-2, and the second conductive semiconductor layer 124C-3 illustrated in FIG. 18 perform the same functions as the first conductive semiconductor layer 124A-1, the active layer 124A-2, and the second conductive semiconductor layer 124A-3, respectively, illustrated in FIG. 9.

However, since the light-emitting element 120C illustrated in FIG. 18 has a flip chip bonding structure, the light discharged from the active layer 124C-2 may be emitted through the first electrode 128C, the first conductive semiconductor layer 124C-1, and the substrate 122C. To this end, the first electrode 128C, the first conductive semiconductor layer 124C-1, and the substrate 122C may be formed of a light-transmitting material. At this time, the second conductive semiconductor layer 124C-3 and the second electrode 129C may be formed of a light-transmitting or non-transmitting material or a reflective material, but the embodiment is not limited to a particular material thereof.

In addition, each of the first and second electrodes 128C and 129C may be formed of any material that may reflect or transmit the light discharged from the active layer 124C-2, rather than absorbing the light, and that may be grown to a high quality on the first and second conductive semiconductor layers 124C-1 and 124C-3. For example, each of the first and second electrodes 128C and 129C may be formed of a metal, and may be formed of Ag, Al, Rh, Pd, Ir, Ru, Mg, Zn, Pt, Au, Hf, or a selective combination thereof.

Referring again to FIG. 17, the light-emitting element package 100C according to the further embodiment may further include first and second solder parts 162 and 164.

The first solder part 162 may be disposed between the first electrode 128C of the light-emitting element 120C and the first lead frame LF1 so as to electrically connect the first electrode 128C and the first lead frame LF1 to each other. Here, the first lead frame LF1 on which the first solder part 162 is disposed may be exposed through the cavity C, rather than being covered with the package body 110. Thus, the first conductive semiconductor layer 124C-1 of the light-emitting element 120C may be electrically connected to the first lead frame LF1 via the first electrode 128C and the first solder part 162.

In addition, the second solder part 164 may be disposed between the second electrode 129C of the light-emitting element 120C and the second lead frame LF2 so as to electrically connect the second electrode 129C and the second lead frame LF2 to each other. Here, the second lead frame LF2 on which the second solder part 164 is disposed may be exposed through the cavity C, rather than being covered with the package body 110. Thus, the second conductive semiconductor layer 124C-3 of the light-emitting element 120C may be electrically connected to the second lead frame LF2 via the second electrode 129C and the second solder part 164.

Each of the first solder part 162 and the second solder part 164 may be a solder paste or a solder ball.

The light-emitting element 120C illustrated in FIGS. 17 and 18 is merely given by way of example, and the embodiment is not limited thereto. That is, as illustrated in FIGS. 17 and 18, the light-emitting element package 100C may include a light-emitting element having any of various shapes of a flip chip bonding structure.

In addition, in the light-emitting element package 100C, the bottom surface CB of the cavity C, which is defined by the exposed top surface of the insulation layer 114 and the first and third element areas DA1 and DA3, may have a circular, oval, or polygonal planar shape based on the purpose and design thereof, but the embodiment is not limited to a particular planar shape. For example, the first and third element areas DA1 and DA3 of the bottom surface CB of the cavity C and the insulation layer 114 may have a rectangular planar shape, as illustrated in FIGS. 15 and 16, and may have a circular planar shape, as illustrated in FIGS. 12 and 13.

Meanwhile, as illustrated in FIG. 8, 14 or 17, in the light-emitting element package 100A, 100B and 100C according to the above-described embodiments, the top surface LFT1 of the first lead frame LF1, the top surface LFT2 of the second lead frame LF2, and the top surface 114T of the insulation layer 114 may be located on the same horizontal plane, rather than being stepped, but the embodiment is not limited thereto. That is, according to another embodiment, the top surface LFT1 of the first lead frame LF1, the top surface LFT2 of the second lead frame LF2, and the top surface 114T of the insulation layer 114 may be stepped, unlike illustration.

In addition, for convenience of description, illustration of the molding member 150 is omitted in FIGS. 1, 6a, 12, 13, 15 and 16. However, as illustrated in FIGS. 8, 14 and 17, the light-emitting element packages 100A, 100B and 100C according to the embodiments may further include the molding member 150. The molding member 150 may surround and protect the light-emitting element 120, 120A, 120B or 120C.

The molding member 150 may be formed of, for example, a transparent polymer resin such as silicon (Si), and may change the wavelength of light emitted from the light-emitting element 120, 120A, 120B or 120C because it includes a fluorescent substance. The fluorescent substance may include any wavelength change material that may change the light generated in the light-emitting element 120, 120A, 120B or 120C into white light such as a YAG-based, TAG-based, silicate-based, sulfide-based, or nitride-based fluorescent substance, but the embodiment is not limited as to the type of the fluorescent substance.

The YAG-based and TAG-based fluorescent substances may be selected from among (Y, Tb, Lu, Sc, La, Gd, Sm)3(Al, Ga, In, Si, Fe)5(O, S)12:Ce, and the silicate-based fluorescent substance may be selected from among (Sr, Ba, Ca, Mg)2SiO4:(Eu, F, Cl).

In addition, the sulfide-based fluorescent substance may be selected from among (Ca, Sr)S:Eu and (Sr, Ca, Ba)(Al, Ga)2S4:Eu, and the nitride-based fluorescent substance may be selected from among (Sr, Ca, Si, Al, O)N:Eu (e.g. CaAlSiN4:Eu (β-SiAlON:Eu) and (Cax, My)(Si, Al)12(O, N)16, which is based on Ca-α SiAlON:Eu (where M is at least one material of Eu, Tb, Yb, or Er, 0.05<(x+y)<0.3, 0.02<x<0.27, and 0.03<y<0.3).

As a red fluorescent substance, a nitride-based fluorescent substance including N (e.g. CaAlSiN3:Eu) may be used. Such a nitride-based red fluorescent substance may have higher reliability with respect to the external environment such as heat and moisture, and lower discoloration possibility than a sulfide-based fluorescent substance.

The light-emitting element packages 100A, 100B and 100C may further include a lens (not illustrated) disposed on the molding member 150. The lens (not illustrated) may adjust the distribution of light discharged from the light-emitting element packages 100A, 100B and 100C.

In addition, in the light-emitting element packages 100A and 100C according to embodiments, the first to third bonding areas BA1 to BA3, the first to third groove portions H1 to H3 for exposing the bonding areas, and the blind hole TH are disposed on the slopes 112A, 112B, 112C, 112D, and 112E at positions at which the package body 110 meets virtual straight extension lines, which connect the side corners CR1, CR2, CR3 and CR4 of the light-emitting elements 120: 120A, 120B and 120C to the center of the bottom surface of the light-emitting elements 120: 120A, 120B and 120C.

For example, referring to FIGS. 1, 6a, 12, 13, 15 and 16, the blind hole TH and the first to third bonding areas BA1 to BA3 are disposed in the bent portions 111A, 111B, 111C and 111D of the slopes 112A, 112B, 112C and 112D. Thus, when the reflectance of the slopes 112A, 112B, 112C, 112D, and 112E is greater than the reflectance of the bottom surface of the cavity C, it is possible to minimize the loss of the reflectance of light in the first to third groove portions H1 to H3, which expose the top surfaces LFT1 and LFT2 of the first and second lead frames LF1 and LF2 corresponding to the bonding areas BA1, BA2 and BA3.

In addition, when the first to third groove portions H1 to H3 for exposing the first to third bonding areas BA1 to BA3 are formed in the bent portions 111A, 111B, 111C and 111D as in the above-described embodiments, in the light-emitting element packages 100A and 100C, the distance between the slopes 112A to 112D and the light-emitting elements 120, 120A, 120B and 120C in the width direction may be further reduced, which may cause increased light extraction efficiency. This is because the distance between the smaller the distance between the slopes 112A to 112D and the light-emitting element 120, the smaller the area of the bottom surface of the cavity C and the greater the area of the slopes 112A to 112D.

Here, the width direction may be the direction crossing the thickness direction of the light-emitting element 120, and for example, may be the direction orthogonal to the thickness direction of the light-emitting element 120. For example, the distance between the slopes 112A to 112E and the light-emitting element 120 may be at least one of the first or fourth distance D1 or D4 in the y-axis direction illustrated in FIGS. 6a, 8, 13, 16 and 17, or the second or third distance D2 or D3 in the x-axis direction.

When each of the first to fourth distances D1 to D4 is less than 30 μm, a process defect, for example, a problem in that the first element area DA1 is not formed over a desired area, may occur. As such, in consideration of a process margin, each of the first to fourth distances D1 to D4 is equal to or greater than 30 μm, and for example, equal to or greater than 50 μm. As described above, the smaller each of the first to fourth distances D1 to D4, the greater the area of the slopes 112A to 112E than the area of the bottom surface of the cavity C, which results in increased light extraction efficiency. Therefore, each of the first to fourth distances D1 to D4 may be 30 μm, but the embodiment is not limited thereto.

The smaller the first to fourth distances D1 to D4, the smaller each of the first and second angles θ1 and θ2, compared to the case in which the first to fourth distances D1 to D4 are increased.

The smaller the first and second angles θ1 and θ2, the greater the area covered with the package body 110, and thus the greater the area of the slopes 112A to 112E. As such, the smaller the exposed area of the first and second lead frames LF1 and LF2 and the greater the area of the slopes 112A to 112E, the greater the capability of light reflection of the light-emitting element packages 100A, 100B and 100C, which may increase light extraction efficiency. This is because the reflectance of the slopes 112A to 112E is greater than the reflectance of the second lead frame LF2. However, when each of the first and second angles θ1 and θ2 is greater than 60°, it may be difficult to anticipate an increase in light extraction efficiency.

In addition, the greater the first and second angles θ1 and θ2, the easier it is for light reflected from the slopes 112A to 112E of the light-emitting element packages 100A, 100B and 100C to escape, which may increase light extraction efficiency. However, when each of the first and second angles θ1 and θ2 is less than 30°, it may be difficult to anticipate an increase in light extraction efficiency.

As described above, the first and second angles θ1 and θ2 may be determined in consideration of both the first and second distances D1 and D2 and the escape of light. That is, the slopes 112A to 112E need to have the first and second angles θ1 and θ2 suitable for the reflection of light. For example, each of the first and second angles θ1 and θ2 may range from 30° to 60°, and for example, may be 45°, but the embodiment is not limited thereto. In addition, when each of the length of the first bonding area BA1 in the x-axis direction and the length of the first bonding area BA1 in the y-axis direction is 0, it may be impossible to secure the area required to bond the other end of the first wire 132 to the second lead frame LF2. In addition, when each of the length of the first bonding area BA1 in the x-axis direction and the length of the first bonding area BA1 in the y-axis direction is greater than 400 μm, the bottom surface of the cavity C, which has lower reflectance than the slopes 112A to 112E, may be excessively exposed, which may deteriorate light extraction efficiency. Thus, the lengths of the first bonding area BA1 in the x-axis and y-axis directions may be greater than 0 μm and equal to or less than 400 μm, but the embodiment is not limited thereto.

When each of the length of the third bonding area BA3 in the x-axis direction and the length of the third bonding area BA3 in the y-axis direction is 0, it may be impossible to secure the area required to bond the other end of the third wire 136 to the second lead frame LF2. In addition, when each of the length of the third bonding area BA3 in the x-axis direction and the length of the third bonding area BA3 in the y-axis direction is greater than 400 μm, the bottom surface of the cavity C, which has lower reflectance than the slopes 112A to 112E, may be excessively exposed, which may deteriorate light extraction efficiency. Thus, each of the length of the third bonding area BA3 in the x-axis direction and the length of the third bonding area BA3 in the y-axis direction may be greater than 0 μm and equal to or less than 400 μm, but the embodiment is not limited thereto.

As described above, the planar area of the first and third bonding areas BA1 to BA3 may range from 0.049 $mm^2$ to 0.15 $mm^2$, and the lengths of the first and third bonding area BA1 and BA3 in the x-axis and y-axis directions may be determined to satisfy the planar area.

In addition, for example, when each of the length of the light-emitting elements 120, 120A, 120B and 120C in the x-axis direction and the length of the light-emitting elements 120, 120A, 120B and 120C in the y-axis direction ranges from 100 μm to 1000 μm, and when each of the length of the first element area DA1 in the x-axis direction and the length of the first element area DA1 in the y-axis direction is less than 150 μm, the area of the front surface of the second lead frame LF2 in which the light-emitting elements 120, 120A, 120B and 120C may be disposed may be reduced. In addition, when each of the length of the first element area DA1 in the x-axis direction and the length of the first element area DA1 in the y-axis direction is greater than 1050 μm, the bottom surface of the cavity C, which has lower reflectance than the slopes 112A to 112D, may be excessively exposed, which may deteriorate light extraction efficiency. Thus, each of the length of the first element area DA1 in the x-axis direction and the length of the first element area DA1 in the y-axis direction may range from 150 μm to 1050 μm, but the embodiment is not limited thereto.

In addition, the minimum value of the respective lengths of the second element area DA2 in the x-axis and y-axis directions is determined by the size of the Zener diode 140. In addition, when each of the length of the second element area DA2 in the x-axis direction and the length of the second element area DA2 in the y-axis direction is greater than 400 μm, the bottom surface of the cavity C, which has lower reflectance than the slopes 112A to 112E, may be excessively exposed, which may deteriorate light extraction efficiency. Thus, the maximum value of each of the length of the second element area DA2 in the x-axis direction and the length of the second element area DA2 in the y-axis direction may be 400 μm, but the embodiment is not limited thereto.

A plurality of light-emitting element packages according to the embodiments may be arranged on a board, and optical members such as a light guide plate, a prism sheet, and a diffuser sheet may be disposed on the optical path of the light-emitting element packages. The light-emitting element packages, the board, and the optical members may function as a backlight unit.

In addition, the light-emitting element package according to the embodiments may be included in a light-emitting apparatus such as a display apparatus, an indicator apparatus, and a lighting apparatus.

Here, the display apparatus may include a bottom cover, a reflector disposed on the bottom cover, a light-emitting module for emitting light, a light guide plate disposed in front of the reflector to guide light emitted from the light-emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. Here, the bottom cover, the reflector, the light-emitting module, the light guide plate, and the optical sheet may form a backlight unit.

In addition, the lighting apparatus may include a light source module that includes a board and the light-emitting element package according to the embodiments, a radiator that dissipates heat of the light source module, and a power supply unit that processes or converts an electrical signal received from the outside to provide the same to the light source module. For example, the lighting apparatus may include a lamp, a headlamp, or a street light.

The headlamp may include a light-emitting module that includes light-emitting element packages disposed on a board, a reflector that reflects light emitted from the light-emitting module in a given direction, for example, in the forward direction, a lens that refracts light reflected by the reflector forward, and a shade that blocks or reflects some of the light, which has been reflected by the reflector to thereby be directed to the lens, so as to realize the light distribution pattern desired by a designer.

The above description merely describes the technical sprit of the embodiments by way of example, and various modifications and substitutions related to the above description are possible by those skilled in the art without departing from the scope and spirit of the disclosure. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

MODE FOR INVENTION

Modes for the implementation of embodiments have sufficiently been described in the "best mode" described above.

INDUSTRIAL APPLICABILITY

A light-emitting element package or a light-emitting apparatus according to the embodiments may be used in display apparatus, an indicator apparatus, a lighting apparatus, and the like.

The invention claimed is:
1. A light-emitting element package comprising;
  first and second lead frames electrically separated from each other;
  a package body comprising a slope configured to define a cavity along with at least one of the first or second lead frame;

at least one element unit disposed in an element area of at least one of the first or second lead frame, the element unit including a light-emitting element and a protective element; and at least one wire configured to connect the at least one element unit to a bonding area of at least one of the first or second lead frame, wherein the package body comprises at least one groove portion disposed to expose the bonding area at a position at which the package body meets an imaginary straight extension line, which interconnects a side corner of the at least one element unit and a center of a bottom surface of the element unit, wherein the package body is disposed between the protective element and the light-emitting element, and wherein the protective element is exposed through a blind hole formed in the package body, and the blind hole is located in a bent portion of the slope.

2. The package according to claim 1, wherein the at least one groove portion is disposed in the bent portion of the slope.

3. The package according to claim 1, wherein the bonding area has a planar area ranging from 0.049 mm$^2$ to 0.15 mm$^2$.

4. The package according to claim 1, wherein the light-emitting element comprises a light-emitting structure comprising first and second conductive semiconductor layers and an active layer and is disposed on the second lead frame.

5. The package according to claim 4, wherein the protective element is disposed on the first lead frame.

6. The package according to claim 5, wherein the at least one wire comprises a first wire configured to electrically interconnect the protective element and the second lead frame.

7. The package according to claim 4, wherein the first and second conductive semiconductor layers of the light-emitting element are directly electrically connected to the first and second lead frames, respectively.

8. The package according to claim 6, wherein the at least one wire further comprises a second wire configured to electrically interconnect the first conductive semiconductor layer of the light-emitting element and the first lead frame.

9. The package according to claim 8, wherein the at least one wire further comprises a third wire configured to electrically interconnect the second conductive semiconductor layer of the light-emitting element and the second lead frame.

10. The package according to claim 9, wherein the at least one bonding area comprises first to third bonding areas, and wherein the at least one groove portion comprises:
a first groove portion configured to expose the first bonding area, which is connected to the first wire and is formed on the second lead frame;
a second groove portion configured to expose the second bonding area, which is connected to the second wire and is formed on the first lead frame; and
a third groove portion configured to expose the third bonding area, which is connected to the third wire and is formed on the second lead frame.

11. The package according to claim 8, wherein the second conductive semiconductor layer of the light-emitting element is directly electrically connected to the second lead frame.

12. The package according to claim 4, wherein the cavity comprises a bottom surface having a polygonal planar shape.

13. The package according to claim 1, wherein the bonding area and the element area are connected to each other in a planar shape.

14. The package according to claim 1, wherein the bonding area and the element area are separated from each other by the package body in a planar shape.

15. The package according to claim 10, further comprising an insulation layer configured to electrically separate the first and second lead frames from each other, wherein the second groove portion exposes the second bonding area, a portion of the insulation layer, and a portion of the second lead frame.

16. The package according to claim 1, wherein the at least one groove portion has at least one of a circular or polygonal planar shape.

17. The package according to claim 5, wherein the package body disposed between the protective element and the light-emitting element has a thickness greater than a thickness of the light-emitting element.

18. The package according to claim 5, wherein the package body disposed between the protective element and the light-emitting element has a thickness greater than a thickness of the protective element.

19. A light-emitting apparatus comprising the light-emitting element package according to claim 1.

* * * * *